US009828687B2

(12) United States Patent
Shaviv et al.

(10) Patent No.: US 9,828,687 B2
(45) Date of Patent: Nov. 28, 2017

(54) METHOD FOR ELECTROCHEMICALLY DEPOSITING METAL ON A REACTIVE METAL FILM

(71) Applicant: APPLIED Materials, Inc., Santa Clara, CA (US)

(72) Inventors: Roey Shaviv, Palo Alto, CA (US); Ismail T. Emesh, Sunnyvale, CA (US); Dimitrios Argyris, Los Altos, CA (US); Serdar Aksu, San Jose, CA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

(21) Appl. No.: 14/637,316

(22) Filed: Mar. 3, 2015

(65) Prior Publication Data
US 2015/0345045 A1 Dec. 3, 2015

Related U.S. Application Data

(63) Continuation-in-part of application No. 14/292,385, filed on May 30, 2014, now abandoned, and a
(Continued)

(51) Int. Cl.
H01L 21/288 (2006.01)
H01L 21/768 (2006.01)
(Continued)

(52) U.S. Cl.
CPC ............. *C25D 7/123* (2013.01); *C25D 3/12* (2013.01); *C25D 3/38* (2013.01); *C25D 3/46* (2013.01);
(Continued)

(58) Field of Classification Search
CPC ............. H01L 21/2885; H01L 21/7768; H01L 21/6843; H01L 21/76846; H01L 21/7685;
(Continued)

(56) References Cited

U.S. PATENT DOCUMENTS 7,070,689 B2 * 7/2006 Thiery .................. C25D 3/565
106/1.29
7,256,120 B2 8/2007 Tsao
(Continued)

OTHER PUBLICATIONS

European Search Report dated Oct. 6, 2015, issued in corresponding European Patent Application 15169686.1, filed May 28, 2015, 8 pages.
(Continued)

*Primary Examiner* — Natalia Gondarenko
(74) *Attorney, Agent, or Firm* — Christensen O'Connor Johnson Kindness PLLC

(57) ABSTRACT

In accordance with one embodiment of the present disclosure, a method for depositing metal on a reactive metal film on a workpiece includes electrochemically depositing a metallization layer on a seed layer formed on a workpiece using a plating electrolyte having at least one plating metal ion, a pH range of about 1 to about 6, and applying a cathodic potential in the range of about −0.5 V to about −4 V. The workpiece includes a barrier layer disposed between the seed layer and a dielectric surface of the workpiece, the barrier layer including a first metal having a standard electrode potential more negative than 0 V and the seed layer including a second metal having a standard electrode potential more positive than 0 V.

12 Claims, 11 Drawing Sheets

Related U.S. Application Data continuation-in-part of application No. 14/292,426, filed on May 30, 2014, now abandoned.

(51) Int. Cl.
| | |
|---|---|
| *C25D 3/38* | (2006.01) |
| *H01L 23/528* | (2006.01) |
| *C25D 7/12* | (2006.01) |
| *H01L 23/532* | (2006.01) |
| *C25D 3/12* | (2006.01) |
| *C25D 3/46* | (2006.01) |
| *C25D 3/48* | (2006.01) |
| *C25D 3/02* | (2006.01) |

(52) U.S. Cl.
CPC ............ *C25D 3/48* (2013.01); *H01L 21/2885* (2013.01); *H01L 21/76843* (2013.01); *H01L 21/76873* (2013.01); *H01L 21/76877* (2013.01); *H01L 21/76879* (2013.01); *H01L 21/76882* (2013.01); *H01L 23/528* (2013.01); *H01L 23/53209* (2013.01); *H01L 23/53238* (2013.01); *H01L 23/53252* (2013.01); *C25D 3/02* (2013.01); *H01L 2221/1089* (2013.01); *H01L 2924/0002* (2013.01)

(58) Field of Classification Search
CPC ......... H01L 21/76849; H01L 21/76879; H01L 23/528; H01L 23/532; H01L 23/53238; H01L 23/53252; H01L 23/53209; H01L 23/53266; H01L 28/75; H01L 21/76877; H01L 21/76882; H01L 21/76843; H01L 21/76873; H01L 2221/1089; H01L 2924/0002; C25D 3/02; C25D 3/12; C25D 3/38; C25D 3/46; C25D 3/48; C25D 7/123

USPC .................. 438/584–688, 694–703; 257/734, 257/E21.584, E23.01

See application file for complete search history.

(56) References Cited

U.S. PATENT DOCUMENTS

| | | | | |
|---|---|---|---|---|
| 8,703,615 | B1* | 4/2014 | Ponnuswamy | C25D 7/123 257/E21.575 |
| 2005/0006245 | A1 | 1/2005 | Sun | |
| 2005/0109627 | A1* | 5/2005 | Sun | C25D 3/38 205/115 |
| 2005/0221602 | A1* | 10/2005 | Bradl | H01L 21/288 438/622 |
| 2006/0105565 | A1 | 5/2006 | Liu | |
| 2008/0296768 | A1 | 12/2008 | Chebiam | |
| 2009/0120799 | A1 | 5/2009 | Sun | |
| 2010/0171220 | A1 | 7/2010 | Huang | |
| 2012/0028073 | A1* | 2/2012 | Ein-Eli | C25D 3/38 428/642 |
| 2012/0205793 | A1* | 8/2012 | Schieffer | H01L 21/321 257/734 |
| 2014/0103534 | A1 | 4/2014 | Emesh | |
| 2015/0262938 | A1* | 9/2015 | Lin | H01L 23/53238 257/751 |
| 2015/0348837 | A1* | 12/2015 | Shaviv | C25D 7/123 438/653 |

OTHER PUBLICATIONS

European Search Report dated Oct. 6, 2015, issued in corresponding European Patent Application 15169683.8, filed May 28, 2015, 9 pages.

\* cited by examiner

10A ALD MnN + Cu Seed
conventional Acid Bath

10A ALD MnN + Cu Seed
Dilute Acid Bath

10A ALD MnN + Cu Seed
Alkaline Chem bath

METHOD FOR ELECTROCHEMICALLY DEPOSITING METAL ON A REACTIVE METAL FILM

CROSS-REFERENCES TO RELATED APPLICATIONS

This application is a Continuation-In-Part of U.S. patent application Ser. No. 14/292,385 and U.S. patent application Ser. No. 14/292,426, both filed on May 30, 2014, the disclosures of which are hereby expressly incorporated herein in their entirety.

BACKGROUND

Semiconductor devices are manufactured by fabrication processes forming electric circuits on a semiconductor substrate, such as a silicon wafer. Metal features, such as copper (Cu) features, are deposited on the substrate to form the electric circuits. A barrier metal layer can be used to prevent the diffusion of copper ions into the surrounding materials. A seed layer can be subsequently deposited on the barrier layer to facilitate copper interconnect plating.

Traditional barrier layers, for example, Ta, Ti, TiN, TaN, etc., are expected to reach their workable limit at a feature size of about 20 nm. Barrier layers explored in recent years for use in small features as viable alternatives to traditional barrier layers include manganese-based barrier layers. For example, suitable barrier layers may include manganese (Mn) and manganese nitride (MnN).

Because of the contact potential between dissimilar metals (for example, a Mn barrier material and a Cu seed material), the electrode potential of the seed material barrier can shift, resulting in barrier dissolution and seed corrosion. Therefore, there exists a need for an improved electrochemical deposition process for reducing barrier dissolution and seed corrosion results. Embodiments of the present disclosure are directed to solving these and other problems.

SUMMARY

The summary is provided to introduce a selection of concepts in a simplified form further described below in the Detailed Description. The summary is not intended to identify key features of the claimed subject matter, nor is it intended to be used as an aid in determining the scope of the claimed subject matter.

In accordance with one embodiment of the present disclosure, a method for depositing metal on a reactive metal film on a workpiece is provided. The method includes electrochemically depositing a metallization layer on a seed layer formed on a workpiece using a plating electrolyte having at least one plating metal ion, a pH range of about 1 to about 6, and applying a cathodic potential in the range of about −0.5 V to about −4 V. The workpiece includes a barrier layer disposed between the seed layer and a dielectric surface of the workpiece, the barrier layer including a first metal having a standard electrode potential more negative than 0 V and the seed layer including a second metal having a standard electrode potential more positive than 0 V.

In accordance with another embodiment of the present disclosure, a method for depositing metal on a reactive metal film on a workpiece is provided. The method includes electrochemically depositing a metallization layer on a seed layer formed on a workpiece using a plating electrolyte having at least one plating metal ion, a pH range of about 1 to about 6, and applying a cathodic potential in the range of about −0.5 V to about −4 V. The workpiece includes a barrier layer disposed between the seed layer and a dielectric surface of the workpiece and a liner layer disposed between the barrier layer and the seed layer, the barrier layer including a first metal having a standard electrode potential more negative than 0 V, the seed layer including a second metal having a standard electrode potential more positive than 0 V, and the liner layer including a third metal having a standard electrode potential more positive than the standard electrode potential of the first metal. The difference between the applied cathodic potential and the mean value of standard electrode potentials of the first, second, and third metals is more than 1.0V.

In accordance with one embodiment of the present disclosure, a microfeature workpiece is provided. The workpiece includes a dielectric surface, a barrier layer on the dielectric surface, the barrier layer including a first metal having a standard electrode potential of less than 0 V, a seed layer on the stack having a thickness of less than 200 Å, the seed layer including a second metal having a standard electrode potential more positive than 0 V, and a liner layer disposed between the barrier layer and the seed layer, the liner layer including a third metal having a standard electrode potential more positive than the standard electrode potential of the first metal. The workpiece further includes a bulk metallization layer on the seed layer, wherein the bulk metallization layer is electrochemically deposited in an electrolyte having a pH in the range of about 1 to about 6.

In accordance with any of the embodiments described herein, the difference between the applied cathodic potential and the mean value of standard electrode potentials of the first and second metals may be more than 1.0 V.

In accordance with any of the embodiments described herein, the thickness of the seed layer may be less than 200 Å.

In accordance with any of the embodiments described herein, the metal ion concentration in the plating electrolyte may be in the range of 0.01M to 0.25M.

In accordance with any of the embodiments described herein, the barrier layer may include a metal or metal compound selected from the group consisting of manganese and manganese nitride on a dielectric layer.

In accordance with any of the embodiments described herein, the seed layer may be a seed stack including a liner layer and a seed layer.

In accordance with any of the embodiments described herein, the workpiece may further includes a liner layer between the barrier layer and the seed layer, wherein the liner layer includes a second metal having a standard electrode potential greater than the standard electrode potential of the first metal.

In accordance with any of the embodiments described herein, the liner layer may include at least one metal selected from the group consisting of ruthenium, cobalt, rhenium, nickel, tantalum, tantalum nitride, and titanium nitride.

In accordance with any of the embodiments described herein, the seed layer may include at least one metal selected from the group consisting of copper, gold, silver, ruthenium, and alloys thereof.

In accordance with any of the embodiments described herein, the plating electrolyte may further include at least one additive selected from the group consisting of suppressor, accelerator, and leveler.

In accordance with any of the embodiments described herein, the additive may be a suppressor selected from the group consisting of polymers having polypropylene glycol moieties.

In accordance with any of the embodiments described herein, metal for the metallization layer may be selected from the group consisting of copper, cobalt, nickel, gold, silver, and alloys thereof.

In accordance with any of the embodiments described herein, the thickness of the barrier layer may be in the range of 1 nm to 3 nm In accordance with any of the embodiments described herein, the thickness of the liner layer may be in the range of 5 Å to 30 Å.

DESCRIPTION OF THE DRAWINGS

The foregoing aspects and many of the attendant advantages of the disclosure will become more readily appreciated by reference to the following detailed description, when taken in conjunction with the accompanying drawings, wherein.

DETAILED DESCRIPTION

The present disclosure relates to methods and plating chemistries to reduce the dissolution of a reactive metal barrier and seed layers in features (such as trenches and vias, particularly in Damascene applications) of a microelectronic workpiece.

Embodiments of the present disclosure are directed to workpieces, such as semiconductor wafers, devices or processing assemblies for processing workpieces, and methods of processing the same. The terms "workpiece," "wafer," and "semiconductor wafer" means any flat media or article, including semiconductor wafers and other substrates or wafers, glass, mask, and optical or memory media, MEMS substrates, or any other workpiece having micro-electric, micro-mechanical, or microelectro-mechanical devices.

Methods described herein are to be used for metal or metal alloy deposition in features of workpieces, including trenches and vias. In one embodiment of the present disclosure, the process may be used in small features, for example, features having a feature critical dimension of less than 50 nm. However, the processes described herein are applicable to any feature size. The dimension sizes discussed in the present application may be post-etching feature dimensions at the top opening of the feature. In one embodiment of the present disclosure, Damascene features may have a size of less than 50 nm. In another embodiment, Damascene features may have a size of less than 40 nm. In another embodiment, Damascene features may have a size of less than 30 nm.

The processes described herein may be applied to various forms of copper, cobalt, nickel, gold, silver, manganese, tin, aluminum, and alloy deposition, for example, in Damascene applications. Processes described herein may also be modified for metal or metal alloy deposition in high aspect ratio features, for example, vias in through silicon via (TSV) features.

The descriptive terms "micro-feature workpiece" and "workpiece" as used herein may include all structures and layers previously deposited and formed at a given point in the processing, and is not limited to just those structures and layers as depicted in FIGS. 1-6.

Although generally described as metal deposition in the present application, the term "metal" also contemplates metal alloys and co-deposited metals. Such metals, metal alloys, and co-deposited metals may be used to form seed layers or to fully or partially fill the feature. Exemplary co-deposited metals and copper alloys may include, but are not limited to, copper manganese and copper aluminum. As a non-limiting example in co-deposited metals and metal alloys, the alloy composition ratio may be in the range of about 0.5% to about 6% secondary alloy metal.

Figure 1:
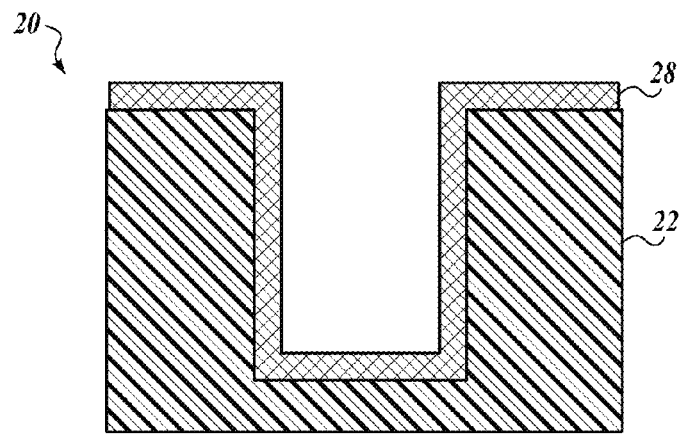
FIGS. 1-3 are a series of schematic diagrams depicting a process and an exemplary feature development of an exemplary embodiment of the present disclosure.
Figure 2:
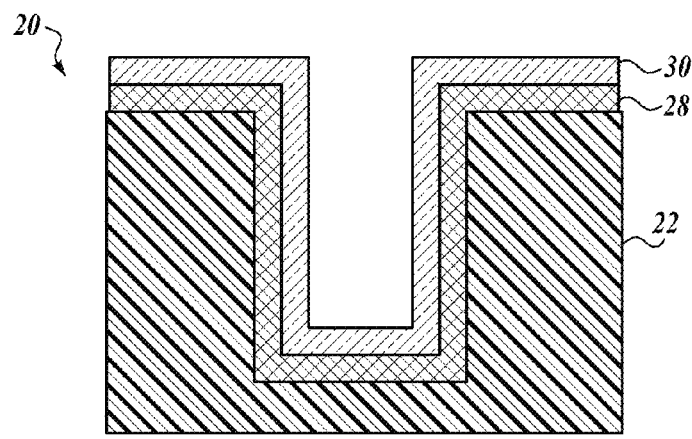
Figure 3:
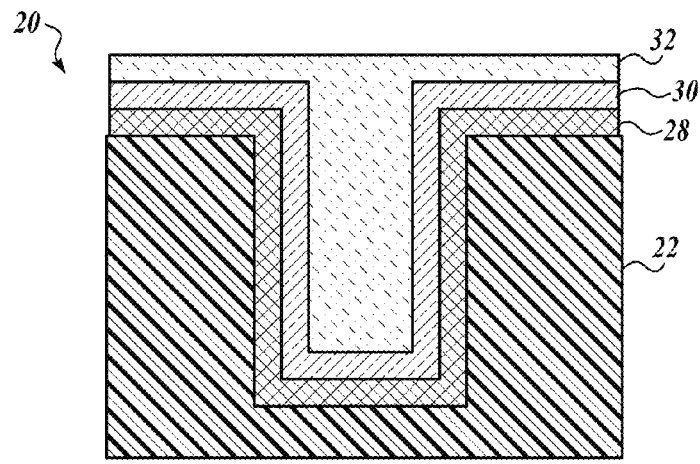

With reference to FIGS. 1-3, a process for forming an exemplary copper interconnect will now be described. As a non-limiting example, the series of layers in a copper interconnect 20 typically include a dielectric layer 22, a barrier layer 28 (see FIG. 1), a seed layer 30 (see FIG. 2), copper fill 32 (see FIG. 3), and a copper cap (not shown).

The conventional fabrication of metal interconnects may include a suitable deposition of a barrier layer on the dielectric material to prevent the diffusion of copper into the dielectric material. Suitable barrier layers include, for example, titanium (Ti), tantalum (Ta), titanium nitride (TiN), tantalum nitride (TaN), etc. Barrier layers are typically used to isolate copper or copper alloys from dielectric material. In recent years, Mn-based barrier layer materials have been developed, such as manganese (Mn) and manganese nitride (MnN).

A seed layer 30 may be deposited on the barrier layer 28. In the case of depositing copper in a feature, there are several exemplary options for the seed layer. First, the seed layer may be a copper seed layer, for example, using a PVD deposition technique. As another non-limiting example, the seed layer may be a copper alloy seed layer, such as copper manganese, copper cobalt, or copper nickel alloys. The seed layer may also be formed by using other deposition techniques, such as CVD or ALD.

Second, the seed layer may be a stack film, for example, a liner layer and a PVD seed layer. A liner layer is a material used in between a barrier and a PVD seed to mitigate discontinuous seed issues and improve adhesion of the PVD seed. Liners are typically noble metals such as ruthenium (Ru), platinum (Pt), palladium (Pd), and osmium (Os), but the list may also include cobalt (Co) and nickel (Ni). Currently, CVD Ru and CVD Co are common liners; however, liner layers may also be formed by using other deposition techniques, such as ALD or PVD.

Third, the seed layer may be a secondary seed layer. A secondary seed layer is similar to a liner layer because it is typically formed from noble metals such as Ru, Pt, Pd, and Os, but the list may also include Co and Ni, and most commonly CVD Ru and CVD Co. (Like seed and liner layers, secondary seed layers may also be formed by using other deposition techniques, such as ALD or PVD.) The difference is the secondary seed layer serves as the seed layer, whereas the liner layer is an intermediate layer between the barrier layer and the PVD Cu seed.

Figure 22A:
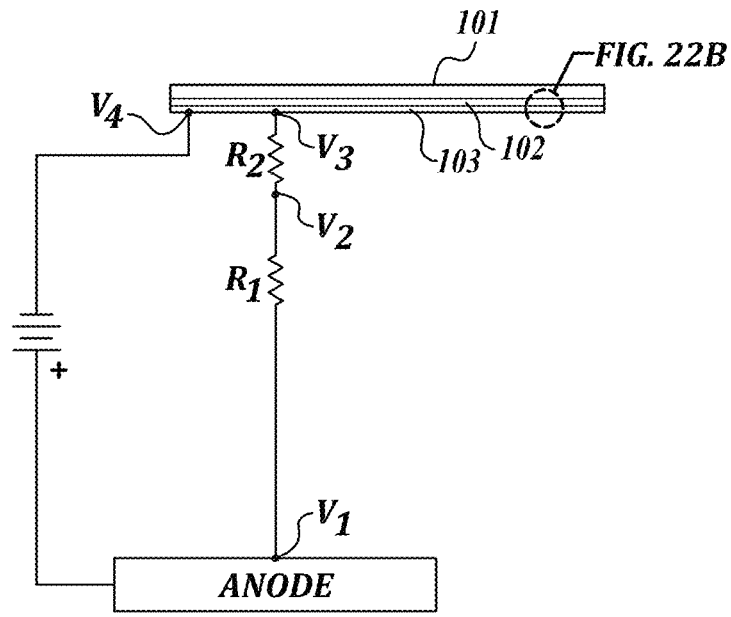
FIGS. 22A-22C are illustrations of a workpiece during an exemplary plating process in accordance with embodiments of the present disclosure.
Figure 22B:
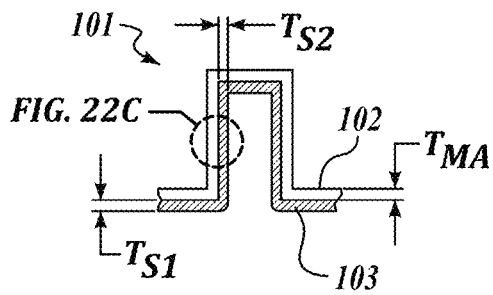
Figure 22C:
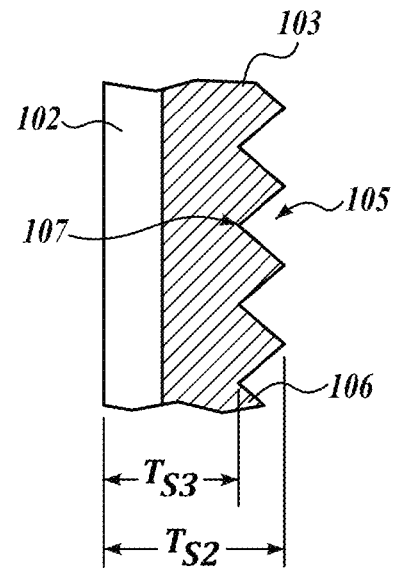

See FIGS. 22A, 22B, and 22C showing a workpiece in an exemplary plating process in accordance with embodiments of the present disclosure. Referring to FIG. 22A, the workpiece includes a substrate 101, a barrier layer 102, and a seed layer 103. In an electrochemical deposition chamber, voltage V1 is applied cathodic potential on the workpiece with respect to the anode, voltage V2 is at the edge of the boundary layer of the workpiece, and voltage V3 is at the surface of the seed layer 103. Resistance R1 is impedance in the plating electrolyte. Resistance R2 is impedance at the boundary layer of the workpiece.

Referring to FIG. 22B, a close-up view of a feature on the workpiece is shown. In the close-up view, seed layer thickness TS1 on the field and the seed layer thickness TS2 on the sidewall in the feature are shown. Referring to FIG. 22C, a close-up view of the feature sidewall shows seed layer roughness 105 including seed layer thickness TS2 in the peaks 106 in the sidewall of the feature TS2 and seed layer thickness TS3 in the valleys 107 in the sidewall of the feature.

After a seed layer has been deposited according to one of the examples described above, the feature may include a seed layer enhancement (SLE) layer, which is a thin layer of deposited metal. As a non-limiting example, an SLE layer may be a copper layer having a thickness of about 2 nm. An SLE layer is also known as an electrochemically deposited seed (or ECD seed), which may be a conformal deposited layer.

An ECD copper seed is typically deposited using an alkaline chemistry including a very dilute copper ethylenediamine (EDA) complex. ECD copper seed may also be deposited using other copper complexes, such as ethylenediamine. glycine, citrate, tartrate, ethylenediaminetetraacetic acid (EDTA), urea, etc., and may be deposited in a pH range of about 2 to about 11, about 3 to about 10, about 4 to about 10, or in a pH range of about 6 to about 10. (For a more detailed discussion of ECD seed and an annealing process to reflow the ECD seed, see discussion of FIGS. 4-6 below.)

After a seed layer has been deposited according to one of the examples described above (which may also include an optional ECD seed), conventional ECD fill and cap may be performed in the feature, for example, using acid plating chemistry at a pH of less than 1.0. Conventional ECD copper acid chemistry may include, for example, copper sulfate, sulfuric acid, methane sulfonic acid, hydrochloric acid, and organic additives (such as accelerators, suppressors, and levelers). The accelerator is used to enhance the plating rate inside the feature, the suppressor to suppress plating on the field, and the leveler to reduce the thickness variation of the plated copper over small dense features and wide ones. The combination of these additives enhances the bottom-up plating inside the feature relative to the plating on the field. Conventional ECD fill is typically bottom-up gap fill, superfill, or super-conformal plating, having a goal of substantially void free fill.

Electrochemical deposition of copper has been found to be the most cost effective manner for depositing a copper metallization layer. In addition to being economically viable, ECD deposition techniques provide a substantially bottom up (e.g., nonconformal or superconformal) metal fill mechanically and electrically suitable for interconnect structures. However, the metallization layer may also be deposited electrolessly.

Conventional barrier layers discussed above (Ti, Ta, TiN, and TaN) are typically formed using a deposition technique called physical vapor deposition (PVD). Because of the thickness of the barrier layer, the integrity of a conventional PVD barrier layer is expected to reach its limit at a feature diameter of about 30 nm.

Manganese-based barrier layers, including manganese (Mn) and manganese nitride (MnN), can be deposited using CVD and ALD deposition techniques with reduced thickness compared to a conventional PVD barrier layer. These manganese-based barrier layers may be conformal. As a non-limiting example, a CVD-Mn barrier layer can be formed with a thickness in the range of about 1 nm to about 3 nm. Such a thickness range for a manganese-based barrier layer appears to have similar barrier properties as an approximate 6 nm PVD-TaN/Ta barrier layer. A thinner barrier layer in small features (e.g., a feature diameter of 50 nm or less) allows for less cladding, resulting in more volume for interconnect metal fill to improve device performance.

In addition to being a relatively thin barrier layer (e.g., compared to a PVD-TaN/Ta barrier layer), a manganese-based barrier layer 28 can form a unique layer when deposited on silicon oxide or a low-K dielectric material 22 (see FIG. 1). The manganese-based barrier layer 28 tends to form a thin self-formed $MnSi_xO_y$ diffusion barrier 28 (e.g., $MnSiO_3$) at the surface of the dielectric layer 22 without significant impact on the dielectric constant of the dielectric layer 22. The self-forming nature of the diffusion barrier layer 28 is the result of chemical interaction between the deposited manganese and the dielectric layer.

The growth of a $MnSi_xO_y$ layer can help to reduce the thickness of the barrier layer. A manganese-based barrier on a silica dielectric surface forms a conformal, amorphous manganese silicate layer to act as a barrier to, for example, copper diffusion into the dielectric film. Most or the entire deposited manganese-based barrier layer may be fully incorporated into the silicate, further reducing the thickness of the barrier layer.

In a typical process, a thin seed layer 30 is used over the barrier layer 28 as a seed for electroplating a metal interconnect 32 (see FIG. 2). The seed layer 30 thickness is typically in the range of between about 10 angstroms and about 600 angstroms. As discussed above, a seed layer 30 may be formed using any of PVD, CVD, or ALD techniques. As a non-limiting example, the seed layer is a PVD copper layer, creating a stack of a manganese-based barrier layer and a copper seed layer. As another non-limiting example, the seed layer is a stack film of a cobalt liner layer and a PVD copper layer, creating a stack of a manganese-based barrier layer, a cobalt liner layer, and a copper seed layer. As another non-limiting example, the seed layer is a secondary seed layer formed from either cobalt or ruthenium, creating a stack of a manganese-based barrier layer and a cobalt or ruthenium secondary seed layer.

Figure 7:
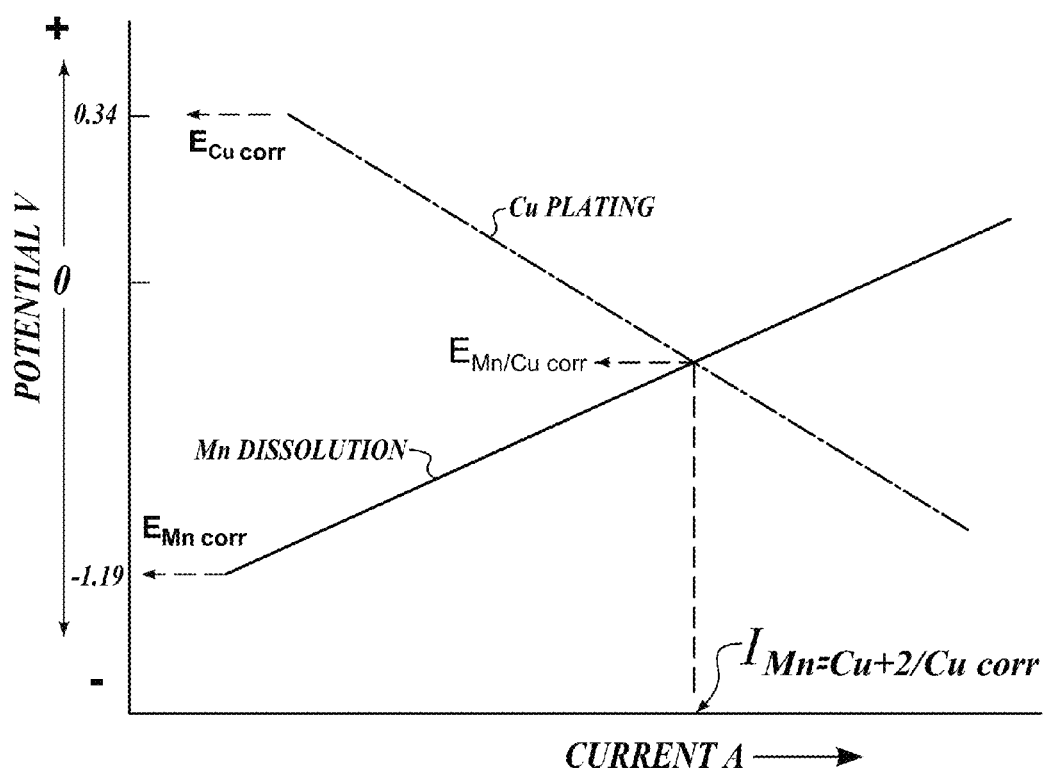
FIG. 7 is a corrosion diagram for a Cu/MnN stack film.

One problem with a manganese-based barrier layer is manganese tends to dissolve in a conventional ECD acid plating electrolyte subsequently used for depositing metallization after the seed layer deposition. Such dissolution and voids created by such dissolution is shown in an exemplary TEM image in FIG. 10. Manganese is highly reactive with a negative standard electrode potential of $E^0_{Mn}=-1.18V$ compared to copper having a standard electrochemical potential of $(E^0_{Cu}=+0.34V)$. Referring to the corrosion diagram for a Cu/MnN stack film in FIG. 7, as Mn donates electrons to Cu, the electrochemical potential of Cu at the Cu/MnN interface changes to a more negative potential and dissolution of Cu and Mn tends to occur.

Although the technology is described herein using a manganese-based barrier layer, in practice, the technology is applicable to any barrier layer including a highly reactive metal. A highly reactive metal may be defined as a metal having a standard electrochemical potential more negative than Cu ($E^0_{Cu}=+0.34V$), more negative than 0 V, or more negative than −0.25 V. Other non-limiting examples of highly reactive metals may include but are not limited to Ni ($E^0_{Ni}=-0.26$ V), Ti ($E^0_{Ti}=-1.37$ V), Co ($E^0_{Co}=-0.28$ V), Fe ($E^0_{Fe}=-0.44$ V), Cr ($E^0_{Cr}=-0.41$ V), Zn ($E^0_{Zn}=-0.76$ V), etc. Therefore, the problem described is not limited to manganese-based barrier layers and extends to any highly reactive barrier layers.

In accordance with one embodiment of the present disclosure, the workpiece includes a barrier layer disposed between the seed layer and a dielectric surface of the workpiece, the barrier layer including a first metal having a standard electrode potential more negative than 0 V and the seed layer including a second metal having a standard electrode potential more positive than 0 V. In accordance with one embodiment of the present disclosure, the workpiece includes a barrier layer disposed between the seed layer and a dielectric surface of the workpiece, the barrier layer including a first metal having a standard electrode potential more negative than −0.10 V and the seed layer including a second metal having a standard electrode potential more positive than +0.10 V. In accordance with one embodiment of the present disclosure, the workpiece includes a barrier layer disposed between the seed layer and a dielectric surface of the workpiece, the barrier layer including a first metal having a standard electrode potential more negative than −0.25 V and the seed layer including a second metal having a standard electrode potential more positive than +0.25 V.

A sufficiently thick and continuous copper seed layer can help prevent dissolution of the manganese-based barrier layer in a conventional acid plating electrolyte. For example, reduced dissolution of Cu and Mn layers is shown in the example provided in FIGS. 20 and 21 for 180 Å and 250 Å Cu layers at the full spectrum of pH: 2, 4, 6, 8, and 9.3).

Although dissolution can be reduced by using a thicker seed layer, a thin seed layer (for example, a Cu seed layer having a nominal thickness of less than 200 Å or less than 100 Å) has a more advantageous effect in a stack film with an ALD or a CVD manganese-based barrier layer. For example, a thin seed layer allows for a greater opening at the mouth of the trench or via helping prevent potential pinch off at the opening of the feature. Because of the dissolution tendencies of the manganese-based barrier layer under a thin Cu layer, electrochemically depositing a metallization layer on a thin copper seed over a manganese-based barrier layer using a conventional ECD acid plating electrolyte presents a technical challenge.

Although not wishing to be bound by theory, the inventors hypothesize the reason for the dissolution of the manganese-based barrier layer in the ECD acid plating electrolyte is the contact potential between dissimilar metals such as manganese and copper changes the standard electrochemical potential of Cu to a more negative potential. The shift results in galvanic corrosion of the seed layer. The magnitude of the shift in electrochemical potential can be dependent on the relative thicknesses of the barrier and seed layers. The ability for electron capturing by the copper seed layer is thickness dependent because, for a thin copper seed, there are only few monolayers of copper seed over the manganese-based barrier layer. In contrast, for an infinitely thick seed layer, the magnitude of the shift in electrochemical potential of the seed layer would be close to zero.

Another hypothesis by the inventors is the thin copper seed layer used in small features may be discontinuous, having breaks or holes allowing an opportunity for galvanic corrosion and dissolution of the manganese based barrier layer. For such thin seed layer thickness, the seed layer film roughness may be less than at least the seed layer film thickness to avoid discontinuities in the seed layer. Referring to FIG. 22C, exemplary valley 107 in seed layer roughness 105 is shown in a seed layer 103 along a sidewall in a feature.

Regardless of the theory for corrosion, the seed layer tends to be only few monolayers thick in small features. Therefore, any corrosion of the seed layer can quickly expose the manganese-based barrier layer to the ECD acid plating electrolyte. Such exposure may lead to rapid dissolution of the manganese-based barrier layer and may even result in a complete removal of the barrier layer. With dissolution of any portion of the barrier layer, the integrity of the microfeature workpiece is compromised.

To reduce dissolution of the barrier layer, alternative approaches for electrochemical deposition are discussed below, including a low acid electrolyte and an alkaline electrolyte, both electrolytes having a dilute metal ion concentration, and a barrier stack layer.

Dilute Metal Ion, Low Acid Electrolyte

Figure 11:
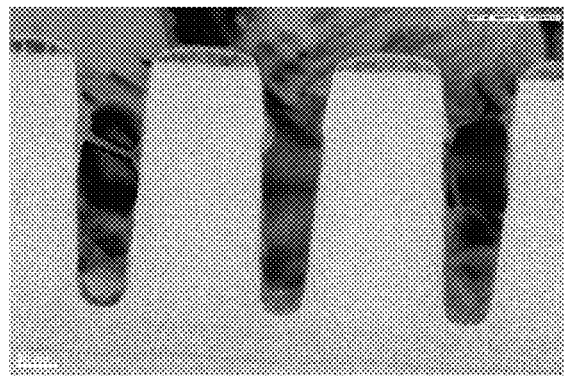
FIGS. 11 and 12 are TEM images of features deposited using methods in accordance with embodiments of the present disclosure.

As a first approach, copper fill can be electrochemically plated in a dilute metal ion, low acid electrolyte, as compared to the conventional acid plating electrolyte. The conventional acid plating electrolyte composition typically includes 40 g/l Cu, 10-100 g/l sulfuric acid, and 50-100 ppm HCl, with a pH of less than 1.0. As a non-limiting example, the concentration of a dilute metal ion, low acid ECD electrolyte includes between about 0.6 g/l and about 15 g/l Cu, between about 1 g/l and about 10 g/l sulfuric acid, and between about 5 ppm and about 50 ppm HCl. A suitable pH for the diluted plating chemistry may be in the range of about 1 to about 5, about 1 to about 6, or about 2 to about 3. A TEM image of an exemplary feature plated using a dilute metal ion, low acid electrolyte is shown in FIG. 11.

The advantageous effect of electrochemically depositing copper in a dilute metal ion, low acid electrolyte is reduction of the dissolution of barrier layer and seed layer stack. In a conventional acid plating electrolyte (typically including 40 g/l Cu, 10-100 g/l sulfuric acid, and 50-100 ppm HCl, with a pH of less than 1.0), cathodic potential is used to make the workpiece more negative to attract positive ions to the workpiece from the electrolyte. Typically, copper has a standard electrochemical potential of $E^0_{Cu}$=+0.34V, and a cathodic potential of −0.7V to −0.9V on the workpiece (measured using a reference electrode) is used to achieve Cu plating on the workpiece. Therefore, in one embodiment of the present disclosure, the difference in cathodic potential on the workpiece is greater than 1.0V to achieve electrochemical deposition of Cu on the workpiece.

Figure 13:
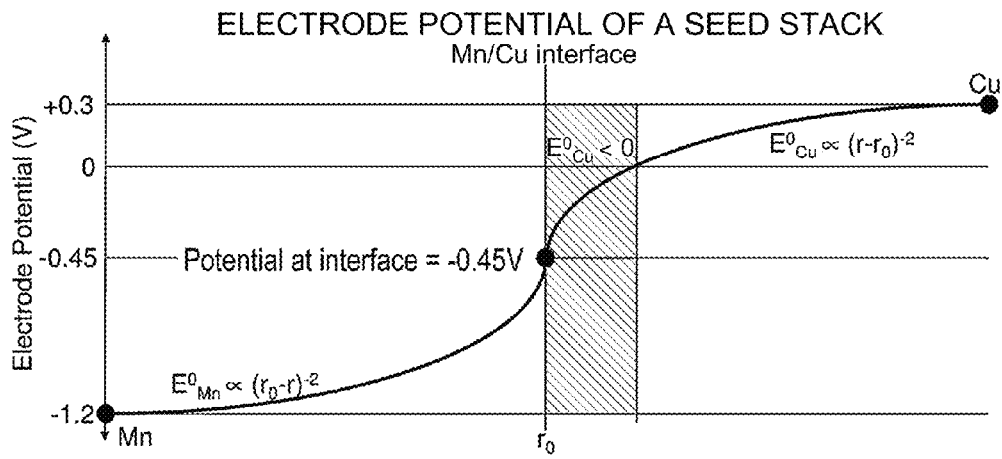
FIG. 13 is a graphical representation of electrode potential for a stack including a MnN barrier layer and copper seed layer.

When Cu is in a stack with Mn ($E^0_{Mn}$=−1.18V), Mn donates electrons to Cu and the electrochemical potential of Cu changes to a more negative potential. The electrochemical potential of Cu at the interface of Mn and Cu is immeasurable. For approximation, the inventors postulate nearly a mean electrochemical potential value of −0.45V at the interface. Referring to FIG. 13, an exemplary schematic of electrode potential of an Mn/Cu interface is shown. To achieve plating on the interface, a difference in cathodic potential of greater than 1.0 V would be at a cathodic potential of −1.45V on the workpiece.

Figure 8:
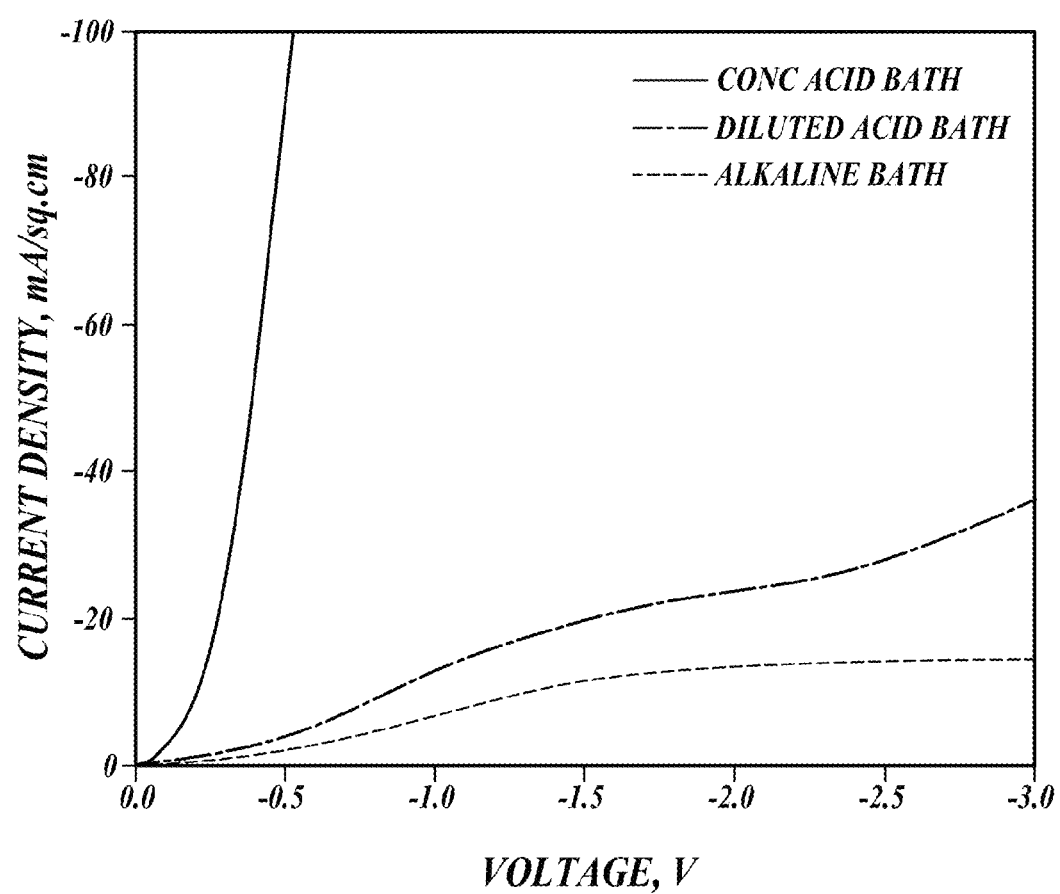
FIG. 8 is an exemplary graphical representation of linear sweep voltammetries provided for various electrolytes: a conventional concentrated ECD copper acid chemistry electrolyte without additives, a conventional concentrated ECD copper acid chemistry electrolyte with additives, a diluted ECD copper acid chemistry electrolyte without additives, and a diluted ECD copper acid chemistry electrolyte with additives.

Referring to the comparative graph in FIG. 8, voltage versus current density is provided for various electrolytes: conventional concentrated ECD copper acid electrolyte without additives and with additives, and diluted ECD copper acid electrolyte without additive and with additives. As can be seen in FIG. 8, in a diluted ECD copper acid electrolyte (as compared to the conventional ECD acid electrolyte), a higher electrical potential (voltage) can be applied workpiece during plating achieving a given current density (for example, compare −20 mA/cm² for each data line in FIG. 8.) Of note, FIG. 8 shows exemplary data plots for respective copper electrolytes: concentrated acid, diluted acid, and alkaline electrolytes. Depending on the copper and acid concentrations and other components in the electrolytes, these curves might change.

In a conventional acid plating electrolyte, Cu will not plate at a cathodic potential of −1.45V on the workpiece. As seen in FIG. 8, voltage of −1.45V in a conventional concentrated bath results in asymptotic current density. Such high current density can affect plating by causing bubbles to form in the bath and additives to be absorbed on the workpiece.

However, a dilute metal ion, low acid electrolyte is more resistive than the conventional acid plating electrolyte, and therefore, can achieve electrochemical deposition at a higher cathodic potential than typically used with a convention acid plating electrolyte. As seen in FIG. 8, voltage of −1.5V in a diluted bath has a current density of about −20 mA/cm². Therefore, electrochemical deposition can be achieved in the dilute metal ion, low acid electrolyte at high cathodic potential of −1.5V.

Figure 9:
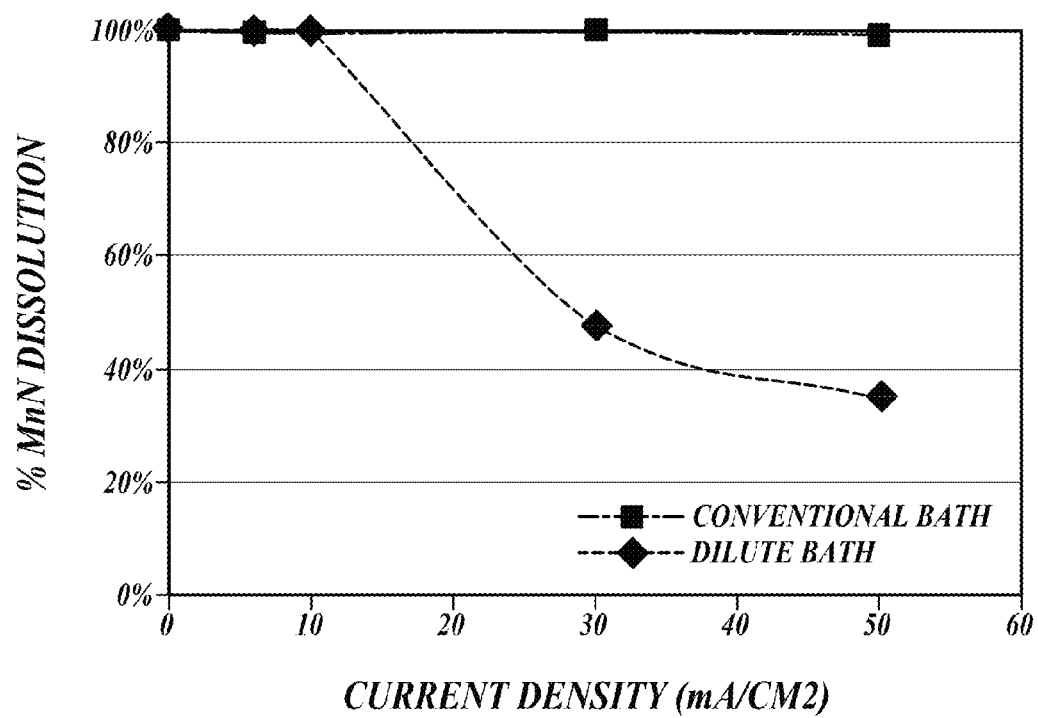
FIG. 9 is a graphical representation of MnN dissolution versus current for a conventional ECD copper acid chemistry electrolyte and a diluted ECD copper acid chemistry electrolyte.

Referring to the comparative graph in FIG. 9, MnN dissolution versus current density is provided for conventional ECD copper acid chemistry and dilute, low acid ECD copper acid chemistry. As can be seen in FIG. 9, in a dilute ECD copper acid electrolyte, dissolution is shown to be reduced for increasing current density. In contrast, in a conventional ECD copper acid electrolyte, little to no reduction in MnN dissolution is achieved for increasing current density.

Another advantageous effect of using a dilute metal ion, low acid electrolyte is a diluted chemistry reduces the plating rate and thus can reduce the opportunity for pinch-off to occur when the plating growth at the mouth of the feature is faster than at the bottom-up fill rate.

In one embodiment of the present disclosure, a dilute metal ion, low acid electrolyte may have a metal ion concentration of less than 0.25 M. In another embodiment of the present disclosure, a dilute metal ion, low acid electrolyte may have a metal ion concentration in the range of 0.01 M to 0.25 M. In another embodiment of the present disclosure, a dilute metal ion, low acid electrolyte may have a metal ion concentration less than 0.1 M.

In a dilute metal ion, low acid electrolye, impedance is high; therefore, changes in current density can be used to assist in plating. Voltage is linearly related to impedance. Thus, at a given impedance, higher voltage will result in higher current. Referring to FIG. 8, impedance in a concentrated metal ion electrolyte is low; therefore at high cathodic potential (voltage), current density become very high (asymptotic) to negatively affect plating.

In contrast, impedance in a dilute metal ion electrolyte is high; therefore, high cathodic potential (voltage) can be achieved on the workpiece despite relatively low current density. For example, in a dilute concentration electrolyte a voltage of −1.5 V is achieved at a current density is −60 mA/cm². Such high cathodic potential on the workpiece may also decrease copper and manganese dissolution as the electrode potential for copper becomes more negative, as shown in the corrosion diagram for a Cu/MnN stack film in FIG. 7.

In accordance with embodiments of the present disclosure, applied cathodic potential on the workpiece with respect to anode may be in a range between −0.5V to −4 V to substantially reduce the dissolution of Cu/MnN during ECD copper plating. As another non-limiting example in accordance with embodiments of the present disclosure, the applied cathodic potential on the workpiece may be in a range between −0.75 to −4 V. As another non-limiting example in accordance with embodiments of the present disclosure, the applied cathodic potential on the workpiece with respect to anode may be in a range between −1.5 to −4 V. Current density associated with such voltage range may vary, and in one embodiment of the present disclosure may be in the range of about −0.5 to about −45 mA/cm². In another embodiment of the present disclosure current density may be in the range of about −10 to about −30 mA/cm².

Potential and current are linearly related to each other by the impedance of the electrolyte bath. Controlling impedance of the bath is a way to allow for a wider range of potentials while keeping current fairly constant. Thermodynamics is related to the free energy through the Gibbs equations. The electrochemistry is therefore related to the potential through the Nernst equation.

Step changes in voltage and current density during plating may further reduce copper and manganese dissolution during bulk metallization electroplating. For example, a first step of high current density plating, followed by one or more subsequent steps of lower current density plating may help achieve high cathodic polarization to decrease copper and manganese dissolution. After a thickness of bulk copper metallization has been deposited, current density may be lowered in the second step to avoid large mass transfer limitations. As a non-limiting example, an initial higher current density step may be in the range of about −5 mA/cm$^2$ to about −45 mA/cm$^2$. A subsequent lower current density step may be in the range of about −0.5 mA/cm$^2$ to about −20 mA/cm$^2$. However, other ranges are within the scope of the present disclosure.

Inclusion of a strong suppressor in a dilute copper ion, low acid electrolyte can also help in increasing the voltage further by creating a potential to plating. Common suppressors are polyethylene glycol, polypropylene glycol and the tri-block copolymers of polyethylene and polypropylene glycol. Strong suppressors typically contain polypropylene glycol moieties strongly adsorbed on the workpiece surface, thus increasing the potential to initiate plating as a result of their strong adsorption. The increased potential created by suppressor adsorption on the workpiece surface helps to protect the copper seed layer from corrosion during bulk metallization plating. Such advantages can be enhanced when combined with an initial high current density step.

Dilute Metal Ion, Alkaline Electrolyte

A second approach to reducing dissolution of the manganese-based barrier layer includes electrochemically depositing copper in a dilute metal ion, alkaline electrolyte, for example, ECD seed chemistry (discussed above).

Plating using a diluted alkaline pH usually occurs at high potential in the range of about −1 V to about −6 V, which is beneficial for reducing the dissolution of highly reactive films such as the manganese-based barrier layer. The voltage range may be slightly higher than a suitable voltage range for a dilute metal ion, low acid electrolyte discussed above. In one embodiment of the present disclosure, a suitable current density for electroplating in an alkaline electrolyte may be in the range of about −0.2 mA/cm$^2$ to about −20 mA/cm$^2$. In another embodiment, a suitable current density for electroplating in an alkaline electrolyte may be in the range of about −1 mA/cm$^2$ to about −5 mA/cm$^2$. However, other ranges are within the scope of the present disclosure.

Figure 12:
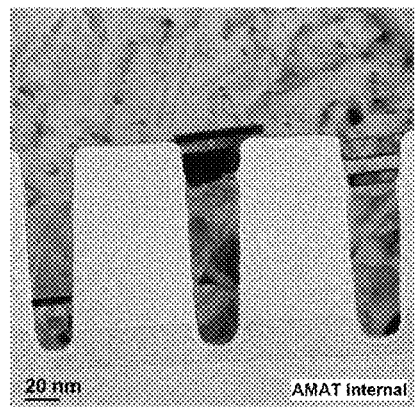

As seen in FIG. 8, voltage of −1.5V in an alkaline has a current density of about −10 mA/cm$^2$. Therefore, electrochemical deposition can be achieved in a dilute metal ion, alkaline electrolyte at high cathodic potential of −1.5V. A TEM image of an exemplary feature plated using a dilute metal ion, alkaline electrolyte is shown in FIG. 12.

In one embodiment of the present disclosure, a suitable pH range may be in the range of about 6 to about 11, about 6 to about 10, about 8 to about 11, about 8 to about 10, and in one embodiment of the present disclosure about 9.3.

As discussed in EXAMPLES 4 and 5 below, little to no corrosion or dissolution of the Cu and Mn layers was observed at a pH of 8 or greater. In acid baths, significant dissolution was observed at a pH of less than 6.

As a non-limiting example, a suitable plating chemistry may include $CuSO_4$, complexing agent such ethylenediamine, glycine, citrate, tartaric acid, ethylenediaminetetraacetic acid (EDTA), urea, etc., and mixtures thereof, and a Ph adjustor, such as tetramethyl-ammonium hydroxide and boric acid.

In one embodiment of the present disclosure, a dilute metal ion, alkaline electrolyte may have a metal ion concentration of less than 0.25 M. In another embodiment of the present disclosure, a dilute metal ion, alkaline electrolyte may have a metal ion concentration in the range of 0.01 M to 0.25 M. In another embodiment of the present disclosure, a dilute metal ion, alkaline electrolyte may have a metal ion concentration less than 0.1 M. In another embodiment of the present disclosure, a dilute metal ion, alkaline electrolyte may have a metal ion concentration in the range of 0.01 M to 0.1 M.

Figure 4:
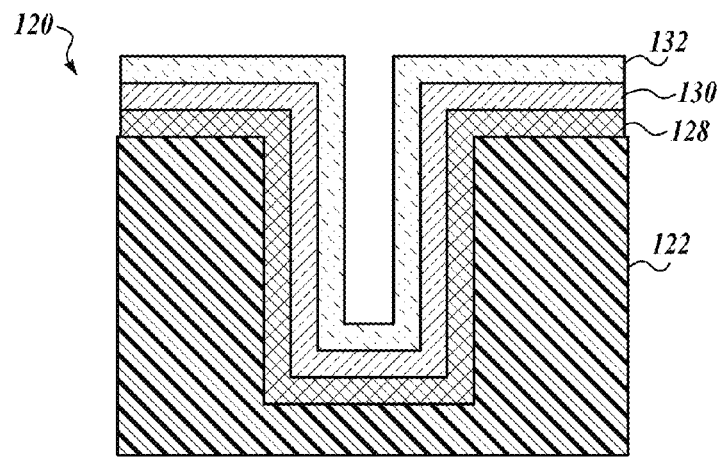
FIGS. 4-6 are a series of schematic diagrams depicting a process and an exemplary feature development of another exemplary embodiment of the present disclosure.
Figure 5:
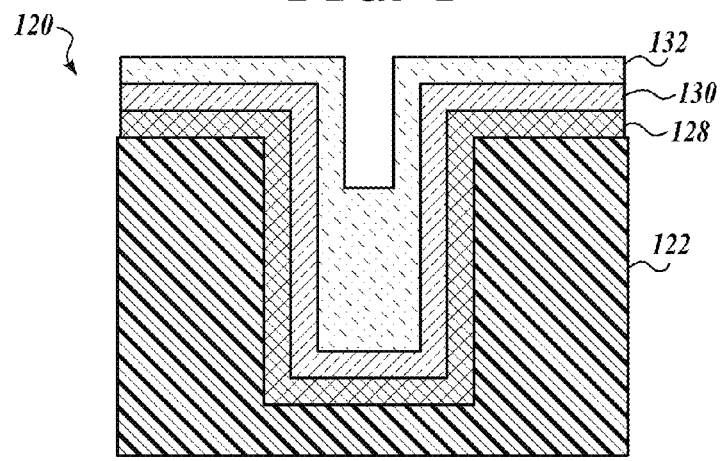
Figure 6:
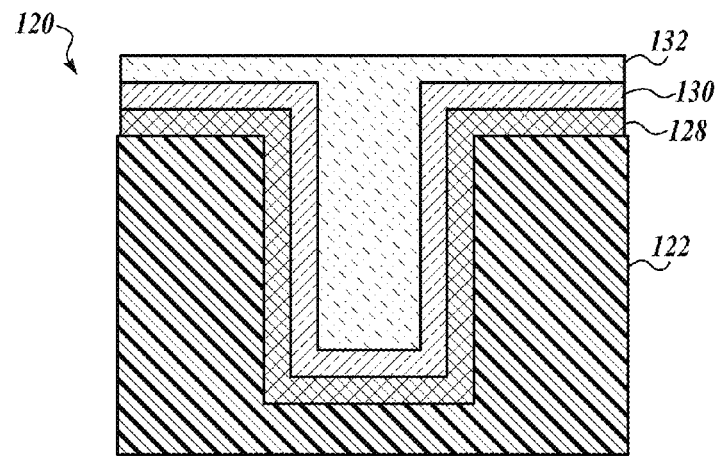

In some embodiments of the present disclosure, deposition may be followed by anneal to enhance the thermal reflow of copper into the feature. As described below with reference to FIGS. 4-6, a process for forming an exemplary copper interconnect 120 using an ECD seed chemistry may include a reflow process. In the example, the formation of the dielectric layer 122, barrier layer 128, and seed layer 130 is identical to the process shown and described with reference to FIGS. 1-3. However, the formation of the copper interconnect 120 is according to a reflow process, as shown in FIGS. 4-6.

After ECD seed deposition, the workpiece may then be subjected to the spin, rinse, and dry (SRD) process or other cleaning processes. The ECD seed is then heated at a temperature warm enough to get the seed to reflow, but not too hot for the workpiece or elements on the workpiece to be damaged or degraded. For example, the temperature may be in the range of about 100 degrees C. to about 500 degrees C. for seed reflow in the features. Appropriate thermal treatment or annealing temperatures are in the range of about 100 degrees C. to about 500 degrees C., and may be accomplished with equipment capable of maintaining sustained temperatures in the range of about 200 degree C. to about 400 degree C., and within the temperature range of about 250 degree C. to about 350 degree C.

The anneal process may occur at atmospheric pressure and may not use a vacuum pressure.

The thermal treatment or annealing process may be performed using a forming or inert gas, pure hydrogen, or a reducing gas such as ammonia ($NH_3$). During reflow, the shape of the deposition changes, and the metal deposit may pool in the bottom of the feature, as shown in FIG. 5. In addition to reflow during the thermal treatment process, the metal deposit may also grow larger grains and reduce film resistivity. An inert gas may be used to cool the workpiece after heating.

After the ECD seed deposition and thermal treatment process has been completed to partially or completely fill the feature and reduce the original aspect ratio, a conventional acid chemistry may be used to complete the deposition process for gap fill and cap deposition. The acid chemistry metal deposition step is generally used to fill large structures and to maintain proper film thickness needed for the subsequent polishing step because it is typically a faster process than ECD seed, saving time and reducing processing costs.

In addition, the ECD seed deposition and reflow steps may be repeated for complete or partial filling of the feature with ECD seed. Processes described herein may include one or more ECD seed deposition, cleaning (such as SRD), and thermal treatment cycles.

Referring to FIGS. 4-6, a reflow process and exemplary features created by the reflow process are depicted. Referring to FIG. 4, the workpiece 120 contains at least one feature in a dielectric material 122 including a barrier layer 128 and a seed layer 130. On the seed layer 130, an ECD seed 132 is deposited. Referring to FIG. 5, the workpiece is annealed at an appropriate temperature to induce a reflow of the ECD seed 132 for partial fill or full fill of the feature. During the anneal step, ECD seed material 132 flows into the feature, while having minimal, if any, detrimental effect on the workpiece 120 or the features included therein.

Referring to FIG. 6, an ECD seed 132 deposition step, anneal step, and reflow step may be repeated to attain the desired characteristics of fill. The number of repeating steps may depend on the structure. Once fill reaches desired dimensions, an exemplary cap step may be used to complete the process in preparation for additional workpiece processing.

ECD on a Barrier Stack

A third approach to reducing dissolution of the manganese-based barrier layer during electrochemical deposition of a bulk metallization layer includes the barrier layer being a barrier stack. For example, the barrier layer stack may include a manganese-based barrier layer, such as Mn or MnN, and another liner layer. The liner layer may be another metal such as cobalt, ruthenium, rhenium, nickel, tantalum, tantalum nitride, or titanium nitride. The barrier layer and liner layer may be deposited in any order in the barrier stack, either with the barrier layer deposited first or the liner layer deposited first as a pre-barrier layer. The liner layer may have a thickness in the range of 5Å to 30Å.

Figure 14:
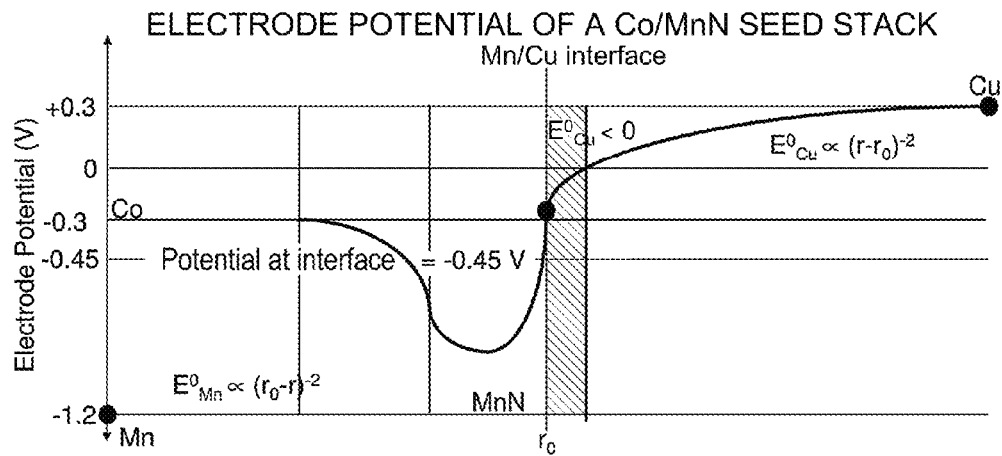
FIG. 14 is a graphical representation of electrode potential for a stack including a Co/MnN stacked barrier layer and copper seed layer.
Figure 15:
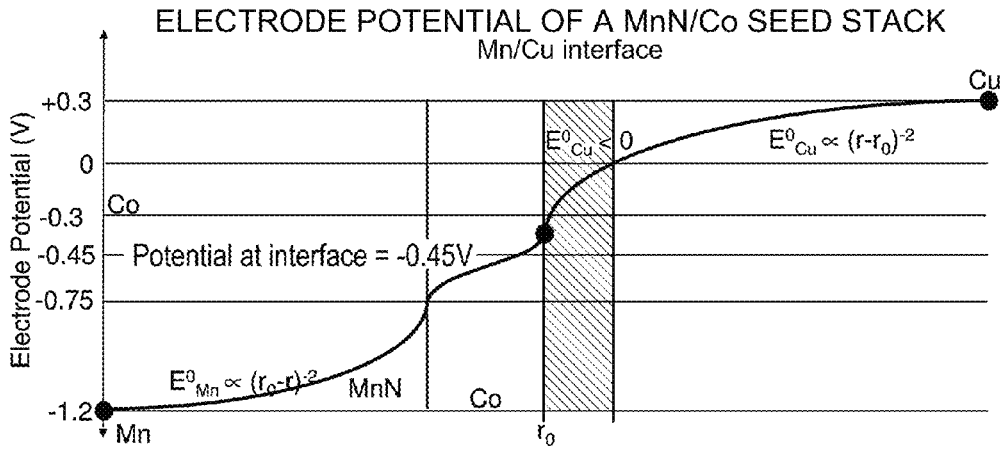
FIG. 15 is a graphical representation of electrode potential for a stack including a MnN/Co stacked barrier layer and copper seed layer.

For comparison, graphical representations of electrode potential for a baseline Mn/Cu stack, a Co/Mn/Cu stack, and a Mn/Co/Cu stack is provided in FIGS. 13-15.

Referring to FIG. 13, a graphical representation of electrode potential for a stack including an MnN barrier layer and Cu seed layer is shown. In the MnN layer, the standard electrode potential for Mn is $E^0_{Mn}=-1.18$ V. Because Cu has a more positive standard electrode potential at $E^0_{Cu}=+0.34$ V, the contact between manganese and copper changes the electrochemical potential of Cu to a more negative potential as Mn donates electrons to Cu through the MnN/Cu interface. The donation of electrons to Cu makes the electrode potential of Mn more positive near the Mn/Cu interface and makes the electrode potential of Cu more negative near the Mn/Cu interface. The donation of electrons to Cu makes the Cu layer more susceptible to corrosion. Therefore, the Cu seed layer may be thick enough to avoid corrosion.

Referring to FIG. 14, a graphical representation of electrode potential for a stack including a Co/MnN stacked barrier layer and a Cu seed layer is shown. Because Co ($E^0_{Co}=-0.28$ V) has a more positive standard electrode potential than Mn ($E^0_{Mn}=-1.18$ V), Mn will donate electrons to Co making the electrode potential of Mn more positive at the Cu interface. Because the electrode potential of Mn is more positive at the Mn/Cu interface than the electrode potential of Mn at a hypothetical Mn/Cu interface without Co (compare FIG. 13), fewer electrons are available to be donated to Cu, resulting in Cu corrosion protection. Therefore, the results show a barrier stack including a Co layer under the MnN layer helps to retard Cu corrosion and MnN dissolution.

Referring to FIG. 15, a graphical representation of electrode potential for a stack including a MnN/Co stacked barrier layer and Cu seed layer is shown. Because Co ($E^0_{Co}=-0.28$ V) has a more positive standard electrode potential than Mn ($E^0_{Mn}=-1.18$ V) and a more negative standard electrode potential than Cu ($E^0_{Cu}=+0.34$ V), Co acts as a buffer between Mn and Cu. As a buffer, Co attracts electrons from Mn and donates electrons to Cu. Because the electrode potential of Co at the Cu interface is more positive than the electrode potential of Mn at a hypothetical Mn/Cu interface without Co (compare FIG. 13), the net result is a Co layer between the MnN layer and the Cu layer helps to retard Cu corrosion and MnN dissolution.

In another exemplary embodiment of the present disclosure, a Ru/MnN stacked barrier layer and a Cu seed layer is provided. Because Ru ($E^0_{Ru}=+0.80$ V) has a more positive standard electrode potential than Mn ($E^0_{Mn}=-1.18$ V), Mn will donate electrons to Ru making the electrode potential of Mn more positive at the Cu interface. Because the electrode potential of Mn is more positive at the Cu interface than the electrode potential of Mn at a hypothetical Mn/Cu interface without Ru, fewer electrons are available to be donated to Cu, resulting in Cu corrosion protection. Therefore, a barrier stack including a Ru layer under a Mn or MnN layer helps to retard Cu corrosion and MnN dissolution.

In another exemplary embodiment of the present disclosure, a MnN/Ru stacked barrier layer and Cu seed layer is provided. Because Ru ($E^0_{Ru}=+0.80$ V) has a more positive standard electrode potential than Mn ($E^0_{Mn}=-1.18$ V) and Cu ($E^0_{Cu}=+0.34$ V), Ru acts as a buffer between Mn and Cu. As a buffer, Ru attracts electrons from Mn. Because the electrode potential of Ru at the Cu interface is more positive than the electrode potential of Mn at a hypothetical Mn/Cu interface without Ru, the net result is a Ru layer between the MnN layer and the Cu layer helps to retard Cu corrosion and MnN dissolution.

EXAMPLE 1

Conventional Acid Chemistry

Figure 10:
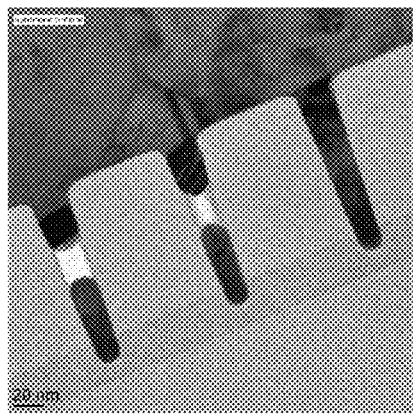
FIG. 10 is a TEM image of a feature deposited using previously designed methods.

Using a conventional ECD acid plating electrolyte, the TEM image in FIG. 10 showed dissolution of the manganese based barrier layer. The plating electrolyte included $CuSO_4$ 40 gm/liter, $H_2SO_4$ 30 gml/liter, HCl 50 ppm, and accelerator, suppressor and leveler additives (6 ml/l, 7 ml/l, and 5 ml/l). Current density for plating was $-9$ mA/cm$^2$.

EXAMPLE 2

Diluted Acid Chemistry

Using a diluted acid plating electrolyte, the TEM image in FIG. 11 showed little to no dissolution of the manganese based barrier layer. The plating electrolyte included $CuSO_4$ 5 gm/liter, $H_2SO_4$ 1 gml/liter, HCl 8 ppm, and accelerator, suppressor and leveler additives (3 ml/l, 2 ml/l, and 0.5 ml/l). Current density for plating was in the range of $-20$ to $-30$ mA/cm$^2$.

EXAMPLE 3

Alkaline Chemistry

Using a diluted alkaline plating electrolyte, the TEM image in FIG. 12 showed little to no dissolution of the manganese based barrier layer. The plating electrolyte included Cu EDA 4 mM, pH 9.3. Current density for plating was $-1$ mA/cm$^2$.

EXAMPLE 4

Varying Copper Thickness and pH

Experiments were run in 0.5 M sodium sulfate solution with varying pH at 2, 4, 6, 8, and 9.3. Starting MnN thickness was 15 Å in all stacks. Starting Cu thickness was variable from 70 Å to 250 Å. Cu and MnN thicknesses were determined by XRF. The results show excessive corrosion at low pH less than 6 with a thin Cu seed layer while almost no corrosion at high pH above 8.

Figure 16:
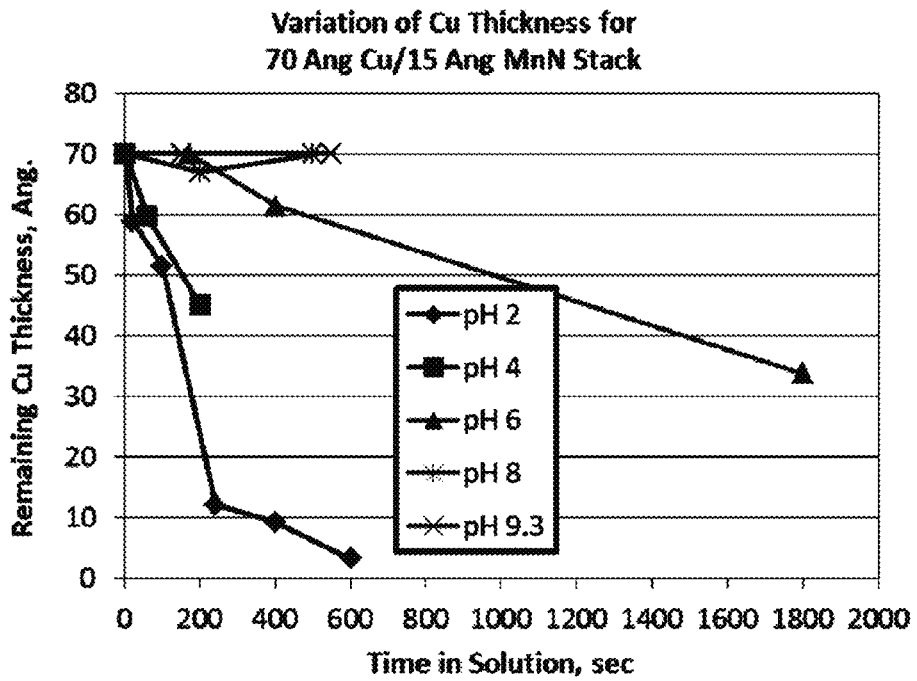
FIG. 16 is a graphical representation of Cu dissolution in a 70 Å Cu, 15 Å MnN stack at various pH levels.
Figure 17:
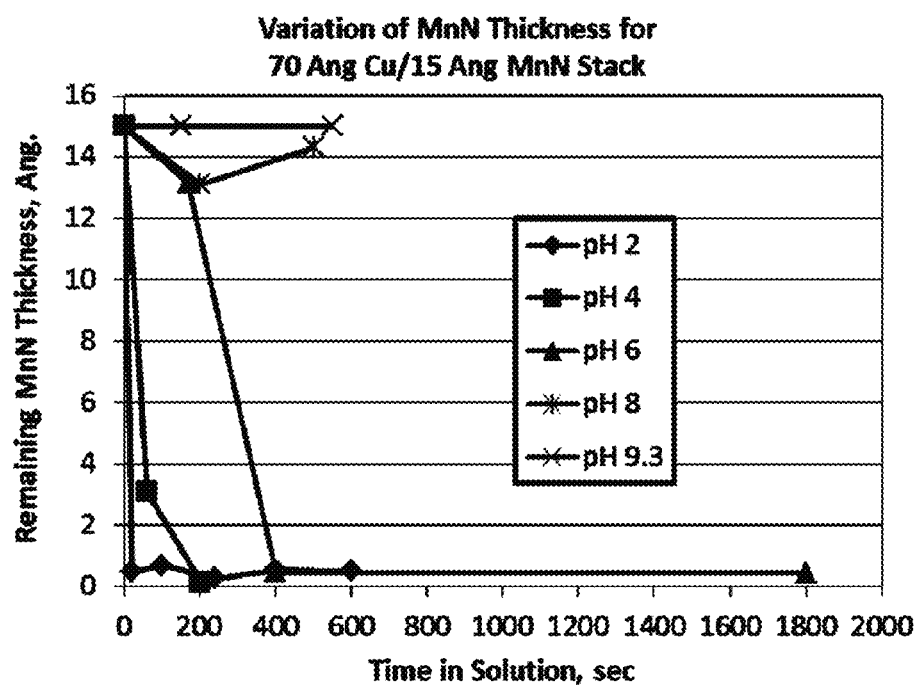
FIG. 17 is a graphical representation of MnN dissolution in a 70 Å Cu, 15 Å MnN stack at various pH levels.

Referring to FIGS. 16 and 17, lab results are provided for workpieces having a stack film of 70 Å Cu and 15 Å Mn disposed in chemistry at pH 2, 4, 6, 8, and 9.3. Significant dissolution of Cu and Mn was observed at time less than 200 seconds at pH 2 and 4, and at time less than 400 seconds at pH 6. For pH 8 and 9.3, the Cu and Mn dissolution appeared to be minimal at time equal to 600 seconds.

Figure 18:
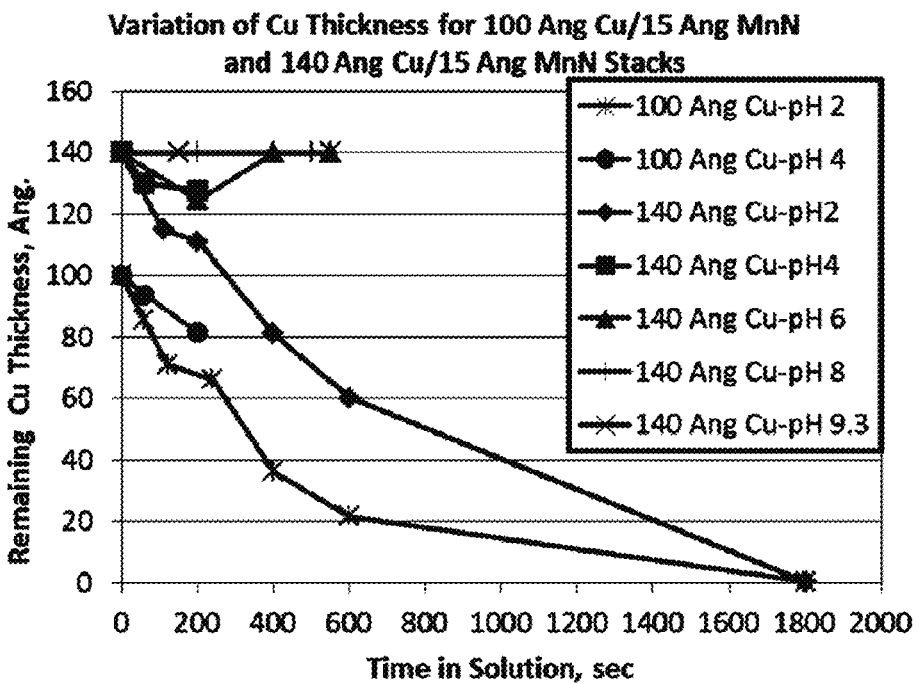
FIG. 18 is a graphical representation of Cu dissolution in a respective 100 Å and 140 Å Cu, 15 Å MnN stack at various pH levels.
Figure 19:
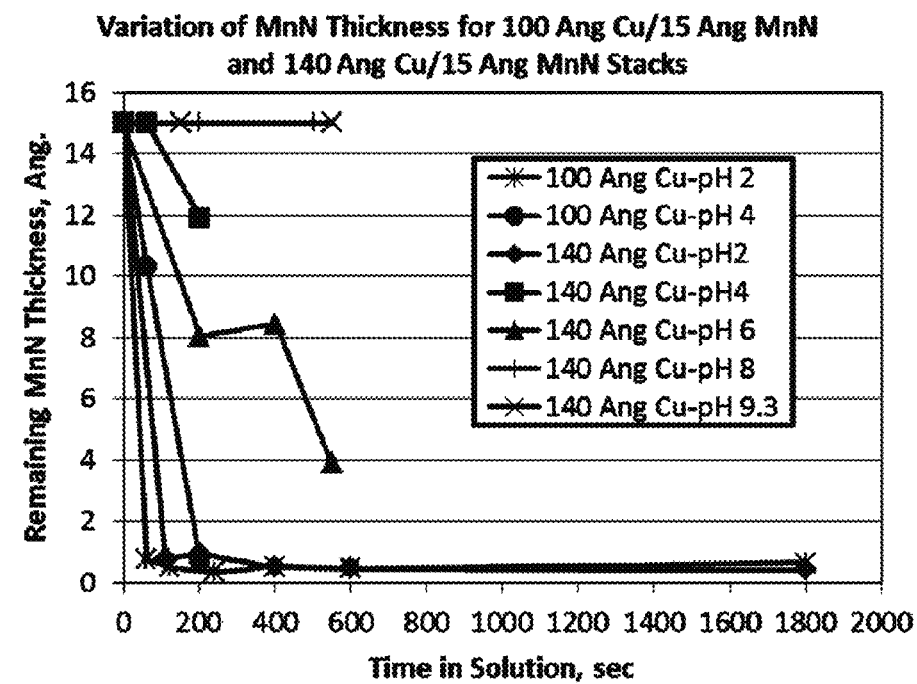
FIG. 19 is a graphical representation of MnN dissolution in a respective 100 Å and 140 Å Cu, 15 Å MnN stack at various pH levels.

Referring to FIGS. 18 and 19, lab results are provided for workpieces having a stack film of 140 Å Cu and 15 Å Mn, disposed in chemistry at pH 2, 4, 6, 8, and 9.3, and workpieces having a stack film of 100 Å Cu and 15 Å Mn, disposed in chemistry at pH 2 and 4. Similar results were observed as seen in FIGS. 16 and 17 for a 70 Å Cu layer. Dissolution of Cu and Mn was observed over time at pH less than 6. For pH 8 and 9.3, the Cu and Mn dissolution appeared to be minimal.

Figure 20:
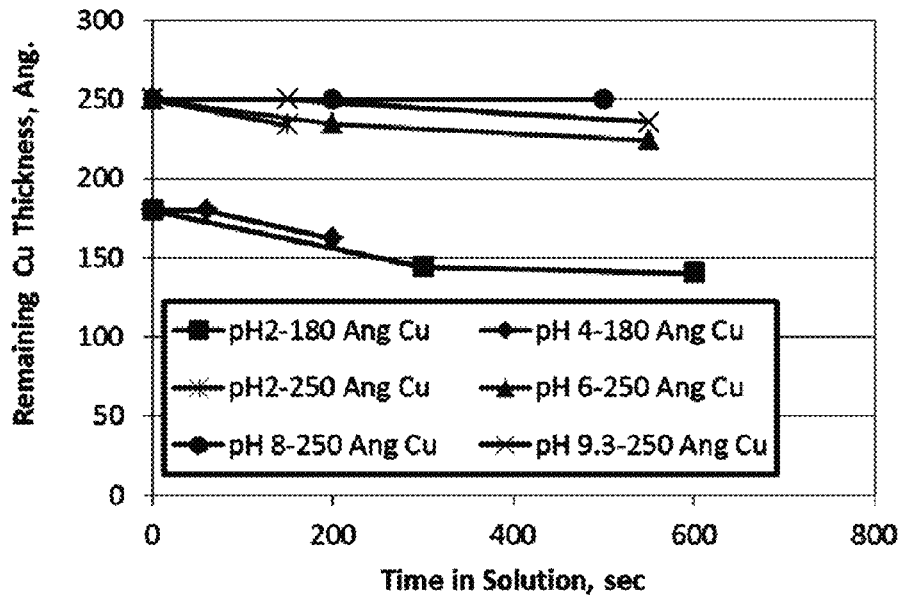
FIG. 20 is a graphical representation of Cu dissolution in a respective 180 Å and 250 Å Cu, 15 Å MnN stack at various pH levels.
Figure 21:
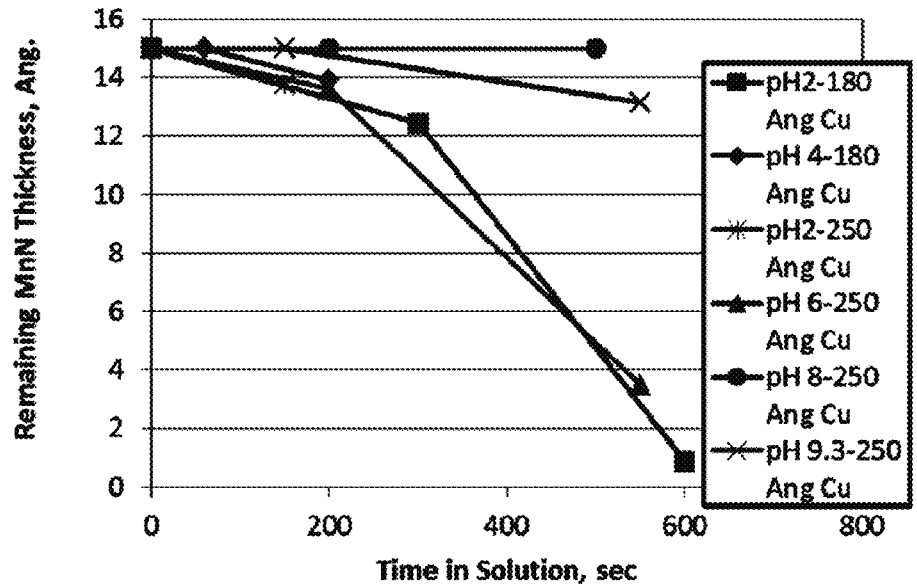
FIG. 21 is a graphical representation of MnN dissolution in a respective 180 Å and 250 Å Cu, 15 Å MnN stack at various pH levels.

Referring to FIGS. 20 and 21, lab results are provided for workpieces having a stack film of 250 Å Cu and 15 Å Mn, disposed in chemistry at pH 2, 6, 8, and 9.3, and workpieces having a stack film of 180 Å Cu and 15 Å Mn, disposed in chemistry at pH 2 and 4. For workpieces having a stack film of 250 Å Cu and 15 Å Mn, little dissolution of Cu and Mn was observed over time of 600 seconds at any of the pH levels. For workpieces having a stack film of 180 Å Cu and 15 Å Mn at pH 2 and 4, Mn dissolution was observed, particularly at time greater than 300 seconds.

EXAMPLE 5

Varying Copper Thickness and pH

Referring to the data below in Table 1 for Cu and MnN loss after 120 seconds in solution at pH 2, 4, 6, 8, and 9.3 for variable initial Cu thickness of 70 Å, 100 Å, 140 Å, 180 Å, and 250 Å, and constant MnN initial thickness of 15 Å. The results show little to no Cu or MnN loss at pH greater than 8. Cu thickness of greater than 180 Å may be adequate to protect MnN from dissolution at lower pH.

TABLE 1

| pH | Initial Cu, Ang | Initial MnN, Ang | Corrosion Duration, sec | Cu remaining, Ang | MnN remaining, Ang |
|---|---|---|---|---|---|
| 2 | 70 | 15 | 0 | 70.0 | 15.0 |
| 2 | 70 | 15 | 20 | 58.8 | 0.5 |
| 2 | 70 | 15 | 100 | 51.5 | 0.7 |
| 2 | 70 | 15 | 240 | 12.1 | 0.3 |
| 2 | 70 | 15 | 400 | 9.2 | 0.6 |
| 2 | 70 | 15 | 600 | 3.2 | 0.5 |
| 2 | 100 | 15 | 0 | 100.0 | 15.0 |
| 2 | 100 | 15 | 60 | 85.5 | 0.8 |
| 2 | 100 | 15 | 120 | 71.2 | 0.5 |
| 2 | 100 | 15 | 240 | 66.0 | 0.3 |
| 2 | 100 | 15 | 400 | 36.2 | 0.5 |
| 2 | 100 | 15 | 600 | 21.6 | 0.5 |
| 2 | 100 | 15 | 1800 | 0.4 | 0.6 |
| 2 | 140 | 15 | 0 | 140.0 | 15.0 |
| 2 | 140 | 15 | 110 | 114.8 | 0.8 |
| 2 | 140 | 15 | 200 | 111.0 | 0.9 |
| 2 | 140 | 15 | 400 | 80.9 | 0.5 |
| 2 | 140 | 15 | 600 | 60.2 | 0.5 |
| 2 | 140 | 15 | 1800 | 0.4 | 0.4 |
| 2 | 180 | 15 | 0 | 180.0 | 15.0 |
| 2 | 180 | 15 | 300 | 144.4 | 12.4 |
| 2 | 180 | 15 | 600 | 140.2 | 0.9 |
| 2 | 250 | 15 | 0 | 250.0 | 15.0 |
| 2 | 250 | 15 | 150 | 233.5 | 13.7 |
| 4 | 70 | 15 | 0 | 70.0 | 15.0 |
| 4 | 70 | 15 | 60 | 59.7 | 3.1 |
| 4 | 70 | 15 | 200 | 45.1 | 0.2 |
| 4 | 100 | 15 | 0 | 100.0 | 15.0 |
| 4 | 100 | 15 | 60 | 93.8 | 10.3 |
| 4 | 100 | 15 | 200 | 81.4 | 0.7 |
| 4 | 140 | 15 | 0 | 140.0 | 15.0 |
| 4 | 140 | 15 | 60 | 130.0 | 15.0 |
| 4 | 140 | 15 | 200 | 127.5 | 11.9 |
| 4 | 180 | 15 | 0 | 180.0 | 15.0 |
| 4 | 180 | 15 | 60 | 180.0 | 15.0 |
| 4 | 180 | 15 | 200 | 162.3 | 13.9 |
| 6 | 70 | 15 | 0 | 70.0 | 15.0 |
| 6 | 70 | 15 | 60 | 59.7 | 3.1 |
| 6 | 70 | 15 | 200 | 45.1 | 0.2 |
| 6 | 140 | 15 | 200 | 124.6 | 8.0 |
| 6 | 140 | 15 | 400 | 140.0 | 8.4 |
| 6 | 140 | 15 | 550 | 140.0 | 3.9 |
| 6 | 250 | 15 | 0 | 250.0 | 15.0 |
| 6 | 250 | 15 | 200 | 234.3 | 13.6 |
| 6 | 250 | 15 | 550 | 224.3 | 3.5 |
| 8 | 70 | 15 | 0 | 70.0 | 15.0 |
| 8 | 70 | 15 | 200 | 66.9 | 13.1 |
| 8 | 70 | 15 | 500 | 69.9 | 14.3 |
| 8 | 140 | 15 | 0 | 140.0 | 15.0 |
| 8 | 140 | 15 | 200 | 140.0 | 15.0 |
| 8 | 140 | 15 | 500 | 140.0 | 15.0 |
| 8 | 250 | 15 | 0 | 250.0 | 15.0 |
| 8 | 250 | 15 | 200 | 250.0 | 15.0 |
| 8 | 250 | 15 | 500 | 250.0 | 15.0 |
| 9.3 | 70 | 15 | 0 | 70.0 | 15.0 |
| 9.3 | 70 | 15 | 150 | 70.0 | 15.0 |
| 9.3 | 70 | 15 | 550 | 70.0 | 15.0 |
| 9.3 | 140 | 15 | 0 | 140.0 | 15.0 |
| 9.3 | 140 | 15 | 150 | 140.0 | 15.0 |
| 9.3 | 140 | 15 | 550 | 140.0 | 15.0 |
| 9.3 | 250 | 15 | 0 | 250.0 | 15.0 |
| 9.3 | 250 | 15 | 150 | 250.0 | 15.0 |
| 9.3 | 250 | 15 | 550 | 235.8 | 13.2 |

While illustrative embodiments have been illustrated and described, various changes can be made therein without departing from the spirit and scope of the disclosure.

The invention claimed is:
1. A method for depositing metal on a reactive metal film on a workpiece, the method comprising:
electrochemically depositing a metallization layer on a seed layer formed on a workpiece, wherein the workpiece includes a nonmetallic substrate having a dielectric layer disposed over the substrate, a barrier layer of manganese or manganese nitride disposed between the seed layer and a dielectric surface of the workpiece, the barrier layer including a first metal of manganese having a standard electrode potential more negative than 0 V, a diffusion barrier layer at an interface between the dielectric layer and the barrier layer, wherein the diffusion barrier layer comprises MnSiO oxide, and the seed layer having a thickness and a sidewall coverage of less than 200 angstroms, wherein the seed layer includes a second metal having a standard electrode potential more positive than 0 V, the workpiece having at least one microfeature comprising a recessed structure having a feature size of less than or equal to 50 nm, the metallization layer formed while preventing dissolution of the seed layer or of the barrier layer, and the metallization layer formed using a plating electrolyte having at least one species of plating metal ions and containing a metal ion concentration of the at least one species of plating metal ions in the plating electrolyte, a pH range of about 1 to about 5, and applying a cathodic potential in a range of from about −0.5 V to about −4 V,
wherein an absolute value of a difference between the applied cathodic potential and a mean value of the standard electrode potentials of the first and second metals is more than 1.0 V.

2. The method of claim 1, wherein the metal ion concentration in the plating electrolyte is in a range of 0.01M to 0.25M.

3. The method of claim 1, wherein the seed layer is a seed stack including a liner layer and a seed layer.

4. The method of claim 1, wherein the workpiece further includes a separate liner layer between the barrier layer and the seed layer, wherein the liner layer includes a second metal having a standard electrode potential greater than the standard electrode potential of the first metal.

5. The method of claim 4, wherein the liner layer includes at least one metal selected from the group consisting of ruthenium, cobalt, rhenium, nickel, tantalum, tantalum nitride, and titanium nitride.

6. The method of claim 1, wherein the seed layer includes at least one metal selected from the group consisting of copper, gold, silver, ruthenium, and alloys thereof.

7. The method of claim 1, wherein the plating electrolyte further includes at least one additive selected from the group consisting of suppressor, accelerator, and leveler.

8. The method of claim 7, wherein the at least one additive is a suppressor selected from the group consisting of polymers having polypropylene glycol moieties.

9. The method of claim 1, wherein metal for the metallization layer is selected from the group consisting of copper, cobalt, nickel, gold, silver, and alloys thereof.

10. The method of claim 1, wherein a thickness of the barrier layer is in a range of 1 nm to 3 nm.

11. The method of claim 4, wherein a thickness of the liner layer is in a range of 5 Å to 30 Å.

12. A method for depositing metal on a reactive metal film on a workpiece, the method comprising:
electrochemically depositing a metallization layer on a seed layer formed on a workpiece, wherein the workpiece includes a nonmetallic substrate having a dielectric layer disposed over the substrate, a barrier layer of manganese or manganese nitride disposed between the seed layer and a dielectric surface of the workpiece, the barrier layer including a first metal of manganese having a standard electrode potential more negative than 0 V, a diffusion barrier layer at an interface between the dielectric layer and the barrier layer, wherein the diffusion barrier layer comprises MnSiO oxide, and the seed layer having a thickness and a sidewall coverage of less than 200 angstroms, wherein the seed layer includes a second metal having a standard electrode potential more positive than 0 V, and a liner layer separate from the seed layer and the barrier layer, the liner layer disposed between the seed layer and the barrier layer, the liner layer including a third metal having a standard electrode potential more positive than the standard electrode potential of the first metal, the workpiece having at least one microfeature comprising a recessed structure having a feature size of less than or equal to 50 nm, the metallization layer formed while preventing dissolution of the seed layer, of the barrier layer, or of the liner layer, and the metallization layer formed using a plating electrolyte having at least one species of plating metal ions and containing a metal ion concentration of the at least one species of plating metal ions in the plating electrolyte, a pH range of about 1 to about 5, and applying a cathodic potential in a range of from about −0.5 V to about −4 V,
wherein an absolute value of a difference between the applied cathodic potential and a mean value of standard electrode potentials of the first, second, and third metals is more than 1.0 V.

* * * * *

UNITED STATES PATENT AND TRADEMARK OFFICE
CERTIFICATE OF CORRECTION

PATENT NO. : 9,828,687 B2
APPLICATION NO. : 14/637316
DATED : November 28, 2017
INVENTOR(S) : Shaviv et al.

Page 1 of 1

It is certified that error appears in the above-identified patent and that said Letters Patent is hereby corrected as shown below:

In the Claims

| Column | Line | Error |
|---|---|---|
| 17 (Claim 4, Lines 3-4) | 15-16 | "second metal" should read --third metal-- |

Signed and Sealed this
Twenty-fifth Day of June, 2019

Andrei Iancu
*Director of the United States Patent and Trademark Office*